United States Patent [19]

Vowles et al.

[11] Patent Number: 5,049,701
[45] Date of Patent: Sep. 17, 1991

[54] EMI CABINET WITH IMPROVED INTERFERENCE SUPPRESSION

[75] Inventors: Edward R. Vowles, Leominster; Daniel J. Calanni, Webster, both of Mass.

[73] Assignee: Stratus Computer, Inc., Marlboro, Mass.

[21] Appl. No.: 414,107

[22] Filed: Sep. 28, 1989

[51] Int. Cl.⁵ .............................................. H05K 9/00
[52] U.S. Cl. .................................. 174/35 R; 361/424
[58] Field of Search .......... 174/35 R, 35 MS, 35 GC, 174/51; 333/243, 244; 361/424

[56] References Cited

U.S. PATENT DOCUMENTS

| 2,317,813 | 4/1943 | Schoenborn | 174/35 GC |
|---|---|---|---|
| 4,322,572 | 3/1982 | Snyder | 174/35 R |
| 4,384,165 | 5/1983 | Loving | 174/35 GC |
| 4,709,121 | 11/1987 | Shores | 174/35 R |
| 4,762,966 | 8/1988 | Kosanda | 174/35 GC |
| 4,780,570 | 10/1988 | Chuck | 174/35 GC |
| 4,785,136 | 11/1988 | Mollet et al. | 174/35 R |
| 4,786,758 | 11/1988 | Zielinski | 174/35 GC |
| 4,803,306 | 2/1989 | Malmquist | 174/35 GC |
| 4,816,612 | 3/1989 | Yeom | 174/35 R |
| 4,816,613 | 3/1989 | Ito et al. | 174/35 R |
| 4,820,885 | 4/1989 | Lindsay | 174/35 GC |
| 4,833,276 | 5/1989 | Ito | 174/35 R |

Primary Examiner—Leo P. Picard
Assistant Examiner—Bot L. Ledynh
Attorney, Agent, or Firm—Lahive & Cockfield

[57] ABSTRACT

An improved cabinet for electromagnetic and radio-frequency interference suppression includes an electrical component-mounting rail that includes a series of spring-like conductive projections or tabs internally formed to extend from its surface. The projections are arranged so that, as a component panel is mounted against the rail, the projections contact the panel at a plurality of points, establishing electrical contact between it and the rail. The projections are positioned to maintain distances between radiation-suppressing low impedance contacts of the rail and component which are small in comparison to wavelength of interference generated by the component and, thereby, to attenuate emissions from the cabinet.

17 Claims, 3 Drawing Sheets

EMI CABINET WITH IMPROVED INTERFERENCE SUPPRESSION

BACKGROUND

This invention relates to housing electrical assemblies and, more particularly, to methods and apparatus for housing electrical components to reduce electromagnetic and radio frequency interference.

Electrical assemblies, e.g., computers, are typically housed in cabinets providing physical support and protection. The time-variant electromagnetic fields generated by those assemblies readily propagate through conducting media and space, and have long plagued manufacturers. These fields, referred to as "EMI" (electromagnetic interference) and "RFI" (radio-frequency interference), can interfere with the other electrical equipment operating in the vicinity. Cabinets designed to shield this interference are known as "EMI cabinets."

The prior art has employed numerous structures for limiting EMI and RFI. U.S. Pat. No. 4,780,570 of Chuck, for example, suggests affixing a strip of conductive finger-like springs to EMI cabinet walls. When an electrical component is inserted into the cabinet, it engages the springs with a wiping contact.

U.S. Pat. No. 4,322,572 of Synder, suggests a similar mechanism for maintaining interference-suppressing electrical contact between a grooved support member, e.g., a cabinet frame, and a closure member, e.g., a side panel, that slides into the groove. The Synder patent discloses a shielding strip having cantilevered springs disposed along one face and tangs disposed along the other. The strip is positioned in the groove so that, as the closure member slides into the groove, it is wipingly engaged by the closure member and its tangs are forced into contact with the groove.

Because they rely on sliding motion, the Chuck and the Synder mechanisms are of little value in limiting interference between components that move into engagement in a direction normal to their surfaces. By way of example, mini- and main-frame computer components are traditionally bolt mounted to EMI racks. To shield these racks, the art has traditionally relied on a braided ground cable or wire mesh applied to the racks prior to installation of the component panels.

Though these techniques have met limited success, breaks in the cable or mesh seal resulting from oxidation, unremoved lacquers or other surface coatings, loss of adhesive strength, and the like can cause the shield to break down, thus permitting excess EMI and RFI. This interference becomes more problematic as operating speeds, e.g., clock speeds, of the component circuitry increases.

Other problems with prior EMI grounding contact devices is that they generally involve added components, which in turn require assembly with exacting electrical connection to other conductive members. Thus these prior practices tend to be costly and prone to failure.

Accordingly, an object of the invention is to provide improved methods and apparatus for housing electrical apparatus.

More particularly, an object is to provide an improved mechanism to attenuate EMI/RFI interference from rack-mounting electrical components.

A further object of the invention is to provide a low-cost and high reliability mechanism for providing EMI/RFI interference-limiting engagement between components which are brought into mounting abutment in a direction normal to their surfaces.

SUMMARY

The invention attains these and other objects with an improved rail for mounting electrical components in an EMI cabinet. The rail includes a series of spring-like conductive projections or tabs integrally formed to extend from a component-mounting surface. The projections are arranged so that, as a component panel is mounted to the rail, the projections contact the panel at a plurality of points, establishing electrical contact between it and the rail. The projections are positioned to maintain selected small distances, in comparison to a wavelength of interference generated by the component, between the radiation-suppressing low impedance contacts of the rail and the component.

In another aspect, the invention provides an improved method of manufacturing an electrically conductive base element, e.g., a mounting rack, of the type described above. The method is characterized by cold-forming the conductive projections integrally into the base element; for example, by lancing tabs into the rail edges. Alternatives include forming the projections within the rail body, for example, with crossed X-shaped, or with single or double U-shaped tab configurations.

An EMI cabinet having a rail constructed in accord with the invention has several advantages over the prior art. Among these is reduced cost resulting from the EMI-suppressing tabs being integral with the rail. Accordingly, there are no inventory and labor costs associated with handling extraneous suppression devices, e.g., braided cables.

The aforementioned objects and advantages are evident in the drawings and in the description which follow.

BRIEF DESCRIPTION OF THE DRAWINGS

A fuller understanding of the invention may be attained by reference to the drawings, in which.

DETAILED DESCRIPTION OF ILLUSTRATED EMBODIMENTS

Figure 1:
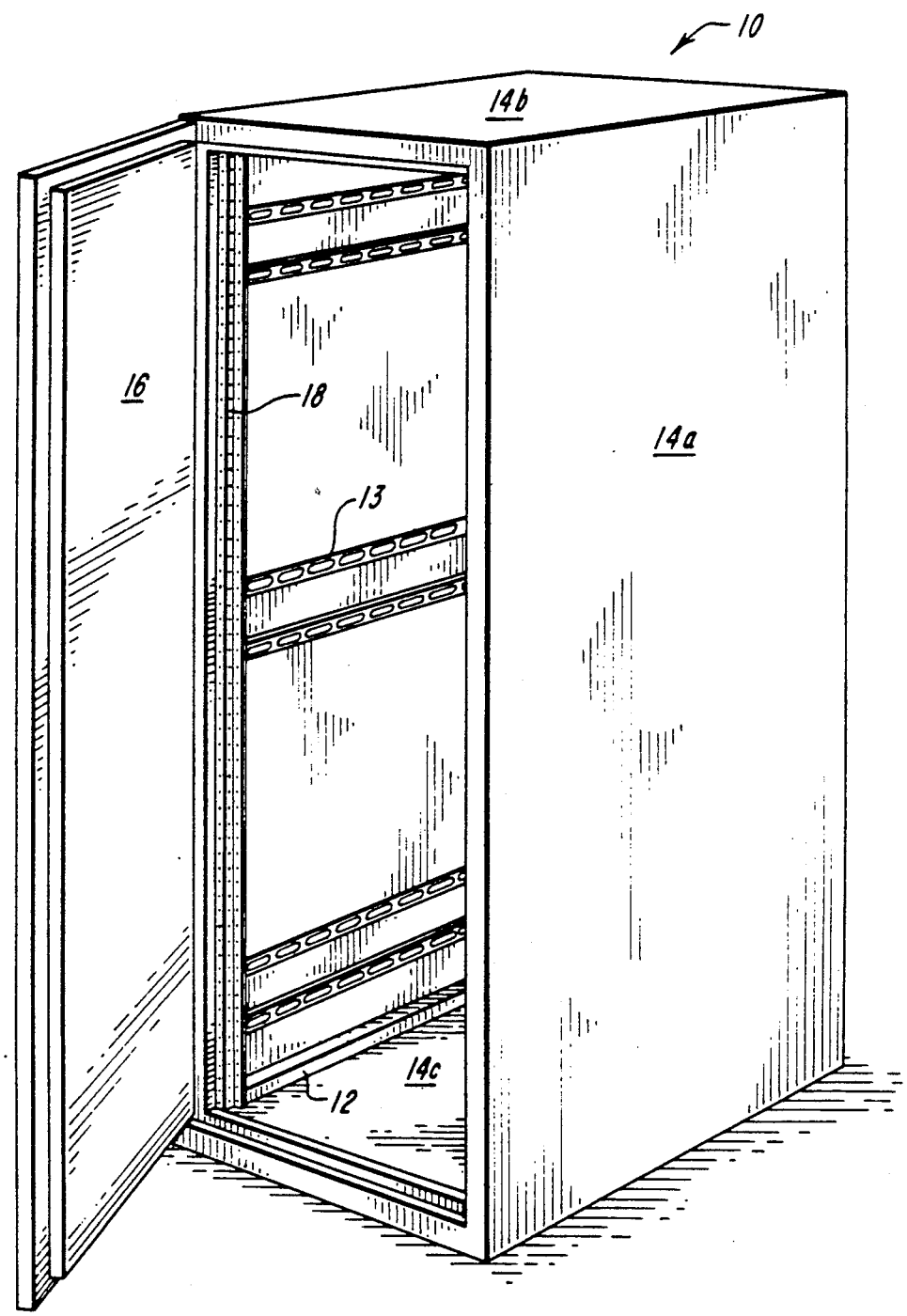
FIG. 1 depicts an EMI cabinet of the type used in conjunction with a preferred practice of the invention.

FIG. 1 depicts an EMI cabinet 10 of the type used in conjunction with a preferred practice of the invention. The cabinet 10 includes a frame having frame channels 12, struts 13, brackets (not shown) and other conventional connecting and structural elements. Covering the exterior surface of the frame are side panels 14a, top panel 14b and bottom panel 14c. A door 16 is hingeably attached to the frame to suppress EMI/RFI emissions during normal operation and to permit access to components housed in the cabinet. Apart from the mounting rails discussed below, the illustrated cabinet 10, including elements 12, 13, 14a, 14b, 14c and 16, can be constructed in a manner conventional to the art and meets, for example, EIA Standard RS-310 for racks, panels and associated equipment.

Illustrated frame channels 12 include four vertical post elements disposed at the front-left, front-right, back-left and back-right corners of the cabinet. Each front post 18, illustrated as at either side of the door 16, includes an integral rail for rack-mounting electronic components, e.g., computer central processor, memory, peripheral control and power modules, having electrically conductive mounting panels.

In accord with standard practice, each such component is mounted in the cabinet 10 by bringing its panel into alignment with the mounting rails, e.g., rail 18, and securing bolts through aligned mounting holes in the rail and in the panel. Those skilled in the art will appreciate that this mounting procedure brings the component panel and the rail into abutment in a direction normal to their contacting surfaces.

Figure 2:
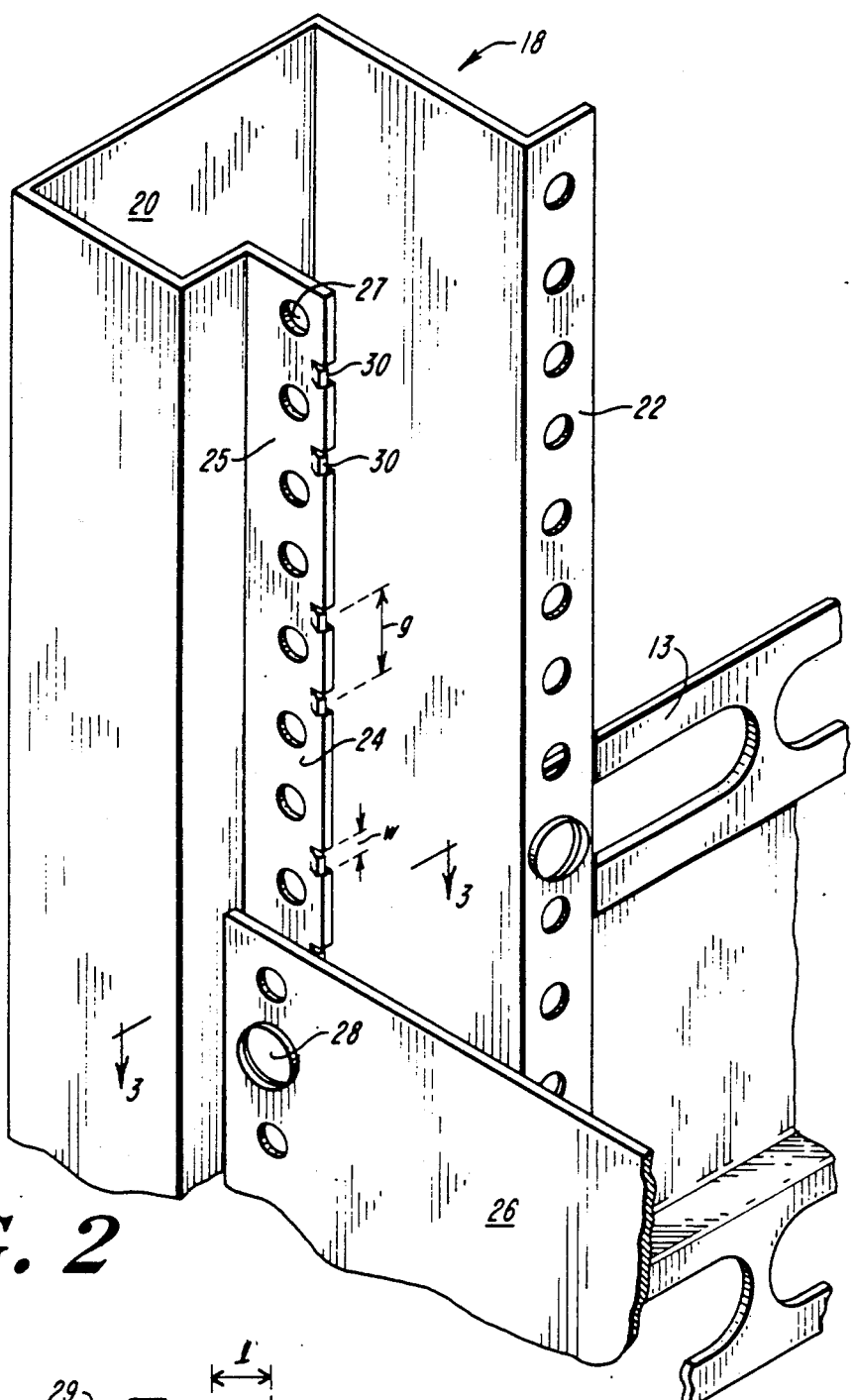
FIG. 2 depicts a mounting rail having integral tab-like conductive projections in accord with a preferred practice of the invention.

FIG. 2 shows the construction of the component-mounting post 18 in greater detail. The illustrated post 18 includes three integral portions: a box-like structural channel 20, a strut web 22, and a mounting rail 24. The post 18 is typically fabricated in one piece from a single length of sheet metal. The channel 20 and the strut web 22 are conventional, and provide structural support for the cabinet 10 and mounting support for braces 13 and panels 14a, 14b, and 14c. The post 18 is typically formed from steel sheet stock.

Figure 3:
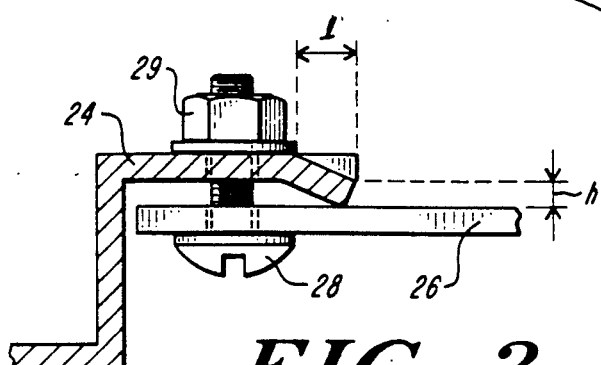
FIG. 3 is a partial sectional view of the mounting rail and panel shown in FIG. 2, along line 3—3.

With reference to FIGS. 2 and 3, the illustrated mounting rail 24 extends from the channel 20 for mounting electrical components in the manner illustrated with a component panel 26. The rail 24 has a conductive flange-like base, preferably of sheet metal integrally formed with the structural channel 20, and is apertured with mounting holes 27, typically with a standard spacing. The rail has a conductive surface 25 against which the component panel 26 is abutably mounted. A fastener illustrated as a bolt 28 secures the panel 26 to the rail 24 and, more particularly, brings them into abutment in a direction normal to their surfaces. The bolt 28 passes through mounting holes 27 in the rail and panel, and is secured by a nut 29.

The rail 24 also has conductive projections 30 resiliently extending from its conductive surface 25. These projections are arranged for contacting the panel 26 upon tightening of the component mounting fasteners, e.g., bolts 28, thereby placing the conductive surface of the rail 24 in electrical contact with panel 26.

The illustrated projections 30 are cold-formed into the edge 24a of the rail 24 by lancing. In a preferred fabrication of the contact projections 30, the sheet metal of the rail is stamped between a pair of mating dies to cut the sides of each projection from the rest of the rail and to deform the projections to a desired projection height (h). As a result, the projections have spring-like resilience which ensures that they attain electrical contact with the panel 26—penetrating, for example, insulating films and oxides on the back mounting surface of the conductive panel 26. The projections, moreover, maintain their shape through repeated removal and replacement of the panel 26.

The projections 30 are lanced, bent, or otherwise formed so that their distal ends stand at a uniform height (h) (FIG. 3) above the surface 25 of rail 24. Preferably, this height (h) is small in comparison with the thickness of the rail. By way of example only, in one specific embodiment where the projections 30 are formed into the edge of a rail 24 of gauge sheet steel, that is 0.075 inch thick, each projection has a height (h) of 0.035 inch and a width (w) between parallel sides of 0.090 inch. This projection height is a fraction of the rail thickness; in this illustrative instance it is in the order of one-half of that thickness. The length (l) of each projection is selected to provide this projection height for the particular sheet material and projection geometry. The height, width and length of each projection 30 in other embodiments can be selected according to the materials and manufacturing procedures, and otherwise as those skilled in the art can determine in accord with this description.

More particularly, each illustrated tab or contact projection 30 has a generally-canilevered structure that joins integrally at the base thereof to the rail base from which it is formed. The length of the juncture of the projection with the rail base, illustrated as the width (w) of the parallel-sided projection 30 of this embodiment, and the length of each tab, illustrated as the length (l), are among the factors that determine the resilient stiffness of each contact.

The mounting holes 27 typically are spaced in accord with the aforementioned EIA standard. The projections 30 are spaced along the rail 24 to ensure that the spacings between electrical contact points of the rail 24 with the component panel 26 are sufficiently small relative to a wavelength of EMI/RFI interference to be attenuated. In this regard, the projections 30 reduce the length of the gaps that exist between the component panel 26 and rail 24, for example, in the region between adjacent bolts 28. These gaps can radiate EMI and RFI in a manner analogous to a slot antenna, and by limiting the length of these gaps, the electrical contacts formed by the projection 30 reduce this unwanted emission. More particularly, the gaps between electrical contacts reduce the shielding effectiveness of the cabinet to a minimal value when the gap length is an odd one-half wavelength of the emission signal. The shielding effectiveness, SE, of the cabinet with the gaps, as measured in decibels, can be approximated by the expression $$0 \leq SE \leq SE_{box} \qquad (1)$$

where $SE_{box}$ is a theoretical maximum shield effectiveness, or attenuation, of the cabinet with no gaps;

SE is the actual shield effectiveness, or attenuation, of the cabinet with gaps and can be expressed as $$SE = 20 \log (\lambda/(2g)) \qquad (2)$$

SE is less than or equal to $SE_{box}$ and is greater than or equal to zero;

$\lambda$ is the wavelength associated with the EMI/RFI to be attenuated; and g is the gap lenth between adjacent projections as illustrated, for example, in FIG. 2.

The improvement in shielding effectiveness, and correspondingly the reduction in emissions, which the invention attains is the difference between the SE without the projections and the SE with the projections.

The projections are located relative to the mounting holes 27, where appropriate, to avoid weakening the rail by having a projection overlap with or extend unduly close to a hole 27.

In one preferred embodiment where the projections are arranged to provide a 40-decibel reduction of EMI/RFI emission, relative to the maximum emission of a gap in a cabinet, the projections are spaced apart with a maximum distance (g) substantially equal to or less than 1/200th of the primary wavelength of emissions produced by the mounted component. By way of further illustration, in a rail 24 constructed fur use with digital data processing apparatus operating at clock speeds of up to 48 MHz, the projections are preferably arranged to maintain a radiation-attenuating spacing (g) that does not exceed 1.2 inches.

Conductive projections as provided in the illustrated embodiment can be incorporated into the conductive panel 26 of the component, alternative to being on the rail 24 or, in addition to projections on the rail, provided the two sets of such projections do not interfere with one another. That is, whereas the illustrated conductive projections 30 are only on the rail 24, the radiation-suppressing characteristics of such projections can also be realized by incorporating them on the surface of the panel 26 that apposes and hence abuts the rail. It will be appreciated that, if such projections are provided on both the rail 24 and the panel 26, those projections be arranged so as not to overlap or otherwise interfere with one another when the component is mounted on the rail.

Figure 4A:
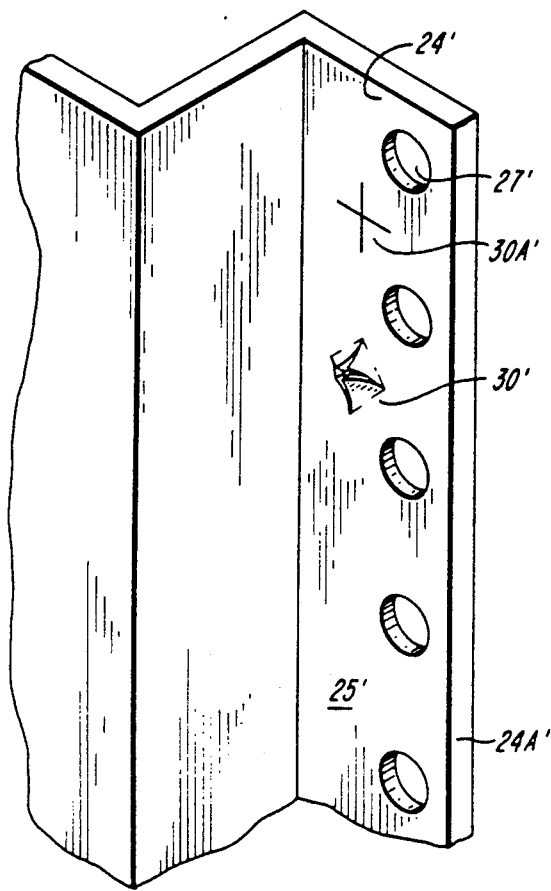
FIGS. 4A, 4B and 4C show a mounting rail incorporating integral cross-cut conductive projections in accord with another practice of the invention.
Figure 4B:
Figure 4C:
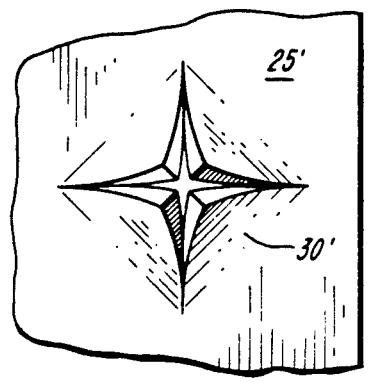

FIGS. 4A-4C depict one alternate configuration for conductive projections 30'. In particular, FIG. 4A shows a section of a rail 24' bearing a conductive projection 30' formed by lancing or otherwise cold-forming a cross-cut pattern, 30A' located within the span of the surface 26' and hence not intersecting the rail edge 24A'. FIGS. 4B and 4C present side and front views of the projection 30'. Each projection 30' formed with this crossed X-shaped configuration has four contact prongs.

Figure 5B:
FIGS. 5A, 5B and 5C show a mounting rail incorporating integral U-cut conductive projections in accord with an alternate practice of the invention.
Figure 5C:
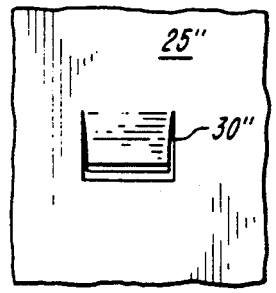
Figure 5A:
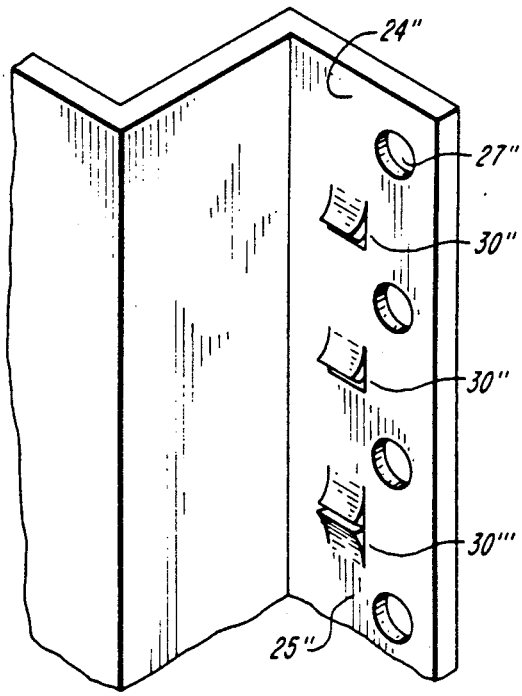

Similarly, FIGS. 5A-5C depict other practices of the invention with conductive projections 30" and 30'". In particular, FIG. 5A shows a section of a rail 24" having a projection 30" formed by lancing or punching a U-shaped cut within the span of surface 25". FIGS. 5B and 5C present side and front views of the projection 30". A further alternative to the U-configured projection 30", which has a single prong, is an H-shape projection 30'"(FIG. 5A) that is formed by two base-to-base U-cuts and that has two opposed projections.

It will thus be seen that the invention attains the objects set forth above and provides an improved EMI suppressing cabinet having a component mounting rail and/or component panel including a series of spring-like conductive projections or tabs integrally formed to extend from at least one abutting mounting surface. The projections are arranged so that, when a component is mounted in abutment with the rail, the projections establish electrical contacts between the panel and rail and closely spaced apart to maintain distances between radiation-suppressing low impedance contacts of the rail and component which are small relative to a wavelength of interference generated by the component.

It will be understood that changes may be made in the above constructions, as well as in the described methods of manufacture, without departing from the scope and spirit of the invention. It is accordingly intended that all matter contained in the above description or shown in the accompanying drawings be interpreted as illustrative rather than in a limiting sense.

Having described the invention, what is claimed as new and secured by Letters Patent is:

1. In the manufacture of an electrically conductive base element for use in an EMI cabinet in which an electrical component is housed,
   said conductive base element having a first surface against which a conductive surface of the component is mounted in abutment with said first surface in a direction substantially normal to that surface,
   the improvement for attenuating radiated electrical interference comprising the steps of
   A. forming a plurality of conductive projections integrally with said base element and extending resiliently from said first surface,
   B. arranging said conductive projections for abutting, in electrically conductive engagement, a conductive surface of a component mounted against said base element, and
   C. providing a selected spacing of said conductive projections to maintain distances between radiation-suppressing low impedance contacts between said base element and the component which are substantially small relative to a wavelength of the interference to be attenuated.

2. In the manufacture of an electrically conductive base element according to claim 1, the further improvement comprising the step of selecting said spacing to maintain said distances to be substantially small in comparison to a wavelength of electromagnetic/radio-frequency interference generated by the component.

3. In the manufacture of an electrically conductive base element according to claim 1, the further improvement comprising the step of selecting said spacing to maintain said distances to be substantially equal to or less than 1/400th of a wavelength of interference generated by the component.

4. In the manufacture of an electrically conductive base element according to claim 1, the further improvement comprising the steps of
   A. forming said conductive base element from metal, and p1 B. cold-forming said conductive base element to form said conductive projections.

5. In the manufacture of an electrically conductive base element according to claim 4, the further improvement comprising the step of forming at least one of said conductive projections to have a tab-like shape and to be disposed at an edge of said conductive base element.

6. In the manufacture of an electrically conductive base element according to claim 1, the further improvement comprising forming said plural conductive projections to extend by substantially the same height above said first surface.

7. In the manufacture of an electrically conductive base element according to claim 1, the improvement comprising forming said plural conductive projections to extend to a height above said first surface which is small in comparison to the thickness of said conductive base element.

8. In the manufacture of an electrically conductive base element according to claim 1, the further improvement comprising the steps of
   A. forming said conductive base element from metal, and
   B. lancing said conductive base element to form said conductive projections.

9. In the manufacture of an electrically conductive base element for use in an EMI cabinet in which an electrical component is housed, said conductive base element having a first surface against which a conductive surface of the component is abutably mounted, said conductive base element having securing means for bringing said conductive surface into abutment with said first surface in a direction substantially normal to that surface, the improvement comprising the steps of
- A. forming said base element from metal sheet material,
- B. forming a plurality of tab-shaped conductive projections integrally with said base element extending from said first surface, said projections being cold-formed on said metallic base element and intersecting an edge thereof,
- C. arranging said conductive projections for abutting, in electrically conductive engagement, a conductive surface of a component mounted against said base element,
- D. providing a selected spacing of said conductive projections to maintain distances between radiation-suppressing low impedance contacts between said base element and said conductive surface which are substantially equal to or less than 1/200th of a wavelength of an electromagnetic/radio-frequency interference generated by said component.

10. In an EMI cabinet for housing an electrical component, said cabinet having an electrically conductive base element with a first surface against which a conductive surface of the component is mounted in abutment with said first surface in a direction substantially normal to that surface, an improvement for attenuating radiated electrical interference and characterized in that
- A. said base element comprising a plurality of conductive projections integrally formed with said base element and projecting resiliently from said first surface thereof, and
- B. adjacent ones of said projections being spaced apart by distances which are a selected small fraction of a half-wavelength of the interference to be attenuated.

11. In an EMI cabinet according to claim 10, the further improvement wherein
- A. said conductive base element is of metal, and
- B. said conductive projections are cold-formed in said conductive base element.

12. In an EMI cabinet according to claim 10, the further improvement wherein at least one of said conductive projections comprises a tab disposed at an edge of said conductive base element.

13. In an EMI cabinet according to claim 10, the further improvement wherein said plurality of conductive projections extend substantially the same height above said first surface.

14. In an EMI cabinet according to claim 10, the further improvement wherein
- A. said conductive base element is of metal sheet material, and
- B. said conductive projections are lanced into said conductive base element.

15. In an EMI cabinet for housing an electrical component according to claim 10, the improvement wherein said projections are arranged to maintain said distances to be substantially equal to or less than 1/200th of a wavelength of an electromagnetic/radio-frequency interference generated by the component.

16. An EMI cabinet for housing an electrical component, comprising
- A. an electrically conductive base element having a conductive surface against which a conductive surface of the component is abutably mounted,
- B. at least a selected one of said conductive surfaces including a plurality of conductive projections formed integrally therewith and extending therefrom,
- C. securing means for bringing the conductive surfaces of said base element and the component into abutment with one another in a direction substantially normal to said conductive surfaces, and for bringing said plurality of integrally-formed conductive projections into electrically conductive engagement with said conductive surfaces,
- D. said plurality of integrally-formed conductive projections being arranged to maintain distances between radiation-suppressing low impedance contacts between said base element and the component which are substantially small in comparison to a wavelength of an electromagnetic/radio-frequency interference to be attenuated.

17. In an EMI cabinet for housing an electrical component, said cabinet havng an electrically conductive base element with an electrically conductive surface against which an electrically conductive surface of said component is abutably mounted, said base element having securing means for bringing said conductive surfaces into abutment in a direction substantially normal to them, the improvement wherein
- A. at least a selected one of said base element and said component comprising plurality of conductive projections integrally formed on the conductive surface thereof,
- B. said projections being arranged to provide electrical contact between said conductive surfaces when said component and said base element are brought into abutment, and
- C. said projections being further arranged so that adjacent ones of them are spaced apart by distances substantially small in comparison to a wavelength of an electromagnetic/radio-frequency interference to be attenuated when said conductive surfaces are brought into abutment by said securing means.

* * * * *